United States Patent
Nelson et al.

(10) Patent No.: US 8,407,564 B2
(45) Date of Patent: Mar. 26, 2013

(54) PREDICTION AND CANCELLATION OF SYSTEMATIC NOISE SOURCES IN NON-VOLATILE MEMORY

(75) Inventors: Scott Nelson, Vancouver (CA); Chun Fung Kitter Man, Vancouver (CA)

(73) Assignee: Intel Corporation, Santa Clara, CA (US)

( * ) Notice: Subject to any disclaimer, the term of this patent is extended or adjusted under 35 U.S.C. 154(b) by 814 days.

(21) Appl. No.: 12/460,221

(22) Filed: Jul. 15, 2009

(65) Prior Publication Data

US 2011/0016372 A1   Jan. 20, 2011

(51) Int. Cl.
   *G11C 7/00*   (2006.01)
   *G11C 11/34*   (2006.01)
(52) U.S. Cl. .... 714/773; 714/718; 714/721; 365/185.03
(58) Field of Classification Search ............... 714/6.1, 714/6.11, 718, 721, 773; 365/185.22, 185.03
   See application file for complete search history.

(56) References Cited

U.S. PATENT DOCUMENTS

| | | | |
|---|---|---|---|
| 4,691,319 A | 9/1987 | Bose et al. | |
| 5,048,023 A | 9/1991 | Buehler et al. | |
| 5,532,962 A | 7/1996 | Auclair et al. | |
| 6,418,051 B2 | 7/2002 | Manstretta et al. | |
| 6,992,932 B2 * | 1/2006 | Cohen | 365/185.2 |
| 7,280,415 B2 | 10/2007 | Hwang et al. | |
| 7,437,641 B1 | 10/2008 | Gorshe | |
| 7,483,311 B2 * | 1/2009 | Aritome | 365/185.3 |
| 7,518,913 B2 * | 4/2009 | Wang et al. | 365/185.03 |
| 7,568,135 B2 | 7/2009 | Cornwell et al. | |
| 7,616,484 B2 | 11/2009 | Auclair et al. | |
| 7,639,542 B2 | 12/2009 | Cornwell et al. | |
| 7,773,022 B2 | 8/2010 | Cornwell et al. | |
| 7,788,553 B2 | 8/2010 | Chow et al. | |
| 7,839,685 B2 | 11/2010 | Auclair et al. | |
| 7,852,690 B2 | 12/2010 | Cornwell et al. | |
| 7,859,908 B2 | 12/2010 | Cornwell et al. | |
| 7,881,108 B2 | 2/2011 | Cornwell et al. | |
| 7,890,818 B2 * | 2/2011 | Kong et al. | 714/704 |
| 7,907,449 B2 * | 3/2011 | Lee et al. | 365/185.17 |
| 7,911,834 B2 | 3/2011 | Cornwell et al. | |
| 7,954,037 B2 * | 5/2011 | Lasser et al. | 714/763 |
| 7,974,132 B2 | 7/2011 | Cornwell et al. | |
| 8,000,134 B2 | 8/2011 | Cornwell et al. | |
| 8,040,725 B2 * | 10/2011 | Kang | 365/185.03 |
| 8,179,718 B2 * | 5/2012 | Cho et al. | 365/185.03 |

(Continued)

OTHER PUBLICATIONS

Office Action received for U.S. Appl. No. 12/288,617, mailed on Nov. 8, 2011, 13 pages.

(Continued)

*Primary Examiner* — Joseph Schell
(74) *Attorney, Agent, or Firm* — Christopher K. Gagne

(57) ABSTRACT

Various embodiments of the invention pertain to a technique of recovering data from a portion of a non-volatile memory which was not reliably read because the number of read errors exceeded the ability of the ECC process to correct those errors. For each cell in that portion of memory, a quantized estimate is made of the amount of offset in the read reference voltage that is predicted to correct for any systematic noise that may have affected the reading of that cell. For each quantized offset, the read reference voltage is adjusted by that amount and data from the relevant cells is read. The combined results for all the cells are then processed through the ECC again.

20 Claims, 4 Drawing Sheets

U.S. PATENT DOCUMENTS

| | | | |
|---|---|---|---|
| 8,276,028 B2 * | 9/2012 | Man et al. | 714/721 |
| 8,291,297 B2 * | 10/2012 | Coulson et al. | 714/764 |
| 2008/0034272 A1 * | 2/2008 | Wu et al. | 714/763 |
| 2008/0077842 A1 | 3/2008 | Gonzalez et al. | |
| 2008/0168320 A1 | 7/2008 | Cassuto et al. | |
| 2008/0320366 A1 * | 12/2008 | Lin | 714/763 |
| 2009/0132758 A1 | 5/2009 | Jiang et al. | |
| 2009/0132895 A1 | 5/2009 | Jiang et al. | |
| 2009/0144600 A1 | 6/2009 | Perlmutter et al. | |
| 2009/0210771 A1 | 8/2009 | Yang et al. | |
| 2009/0292969 A1 | 11/2009 | Man et al. | |
| 2009/0292971 A1 | 11/2009 | Man et al. | |
| 2009/0310408 A1 * | 12/2009 | Lee et al. | 365/185.03 |
| 2009/0323418 A1 * | 12/2009 | Cornwell et al. | 365/185.09 |
| 2010/0070798 A1 | 3/2010 | Cornwell et al. | |
| 2011/0099438 A1 | 4/2011 | Gonzalez et al. | |
| 2011/0170348 A1 | 7/2011 | Cornwell et al. | |

OTHER PUBLICATIONS

Response to Office Action received for U.S. Appl. No. 12/288,617, filed on Apr. 6, 2012, 12 pages.
Response to Office Action received for U.S. Appl. No. 12/288,617, filed on Jan. 13, 2012, 10 pages.
Office Action received for U.S. Appl. No. 12/283,832, mailed on Apr. 3, 2012, 13 pages.
Response to Office Action received for U.S. Appl. No. 12/283,832, filed on Feb. 27, 2012, 10 pages.
Office Action received for U.S. Appl. No. 12/283,832, mailed on Dec. 8, 2011, 14 pages.
Office Action received for U.S. Appl. No. 12/288,617, mailed on Feb. 2, 2012, 13 pages.
Office Action received for U.S. Appl. No. 12/288,617, mailed on Apr. 20, 2012, 14 pages.
Office Action received for U.S. Appl. No. 12/283,861, mailed on Nov. 4, 2011, 11 pages.
Response to Office Action received for U.S. Appl. No. 12/283,861, filed on Jan. 17, 2012, 9 pages.
Notice of Allowance received for U.S. Appl. No. 12/283,861, mailed on Feb. 9, 2012, 5 pages.
Notice of Allowance received for U.S. Appl. No. 12/283,861, mailed on Jun. 5, 2012, 16 pages.
Chun Fung Kitter Man et al., U.S. Appl. No. 12/283,832, filed Sep. 16, 2008 entitled "Adjustable Read Reference for Non-Volatile Memory".
Chun Fung Kitter Man et al., U.S. Appl. No. 12/283,861, filed Sep. 16, 2008 entitled "Using Error Information from Nearby Locations to Recover Uncorrectable Data in Non-Volatile Memory".
Richard Rick Coulson et al., U.S. Appl. No. 12/316,986, filed Dec. 18, 2008 entitled "Data Error Recovery in Non-Volatile Memory".

* cited by examiner

PREDICTION AND CANCELLATION OF SYSTEMATIC NOISE SOURCES IN NON-VOLATILE MEMORY

BACKGROUND

Some types of non-volatile memories are subject to errors in the data read from the memory, and that are caused by electrical noise. Such noise can be either random or systematic, or in some cases may have a component of each. Random noise may be difficult or even impossible to predict, but in many cases systematic noise may be predictable. Systematic noise that is the same for all cells in a page may be handled by various page-wide techniques, such as a moving read reference algorithm. However, if the systematic noise component is cell-dependent, or physical area-dependent, a page-wide treatment may not be effective since the read reference voltage is the same for all cells in the page. A more sophisticated approach is needed for such situations.

BRIEF DESCRIPTION OF THE DRAWINGS

Some embodiments of the invention may be understood by referring to the following description and accompanying drawings that are used to illustrate embodiments of the invention. In the drawings.

DETAILED DESCRIPTION

Figure 1:
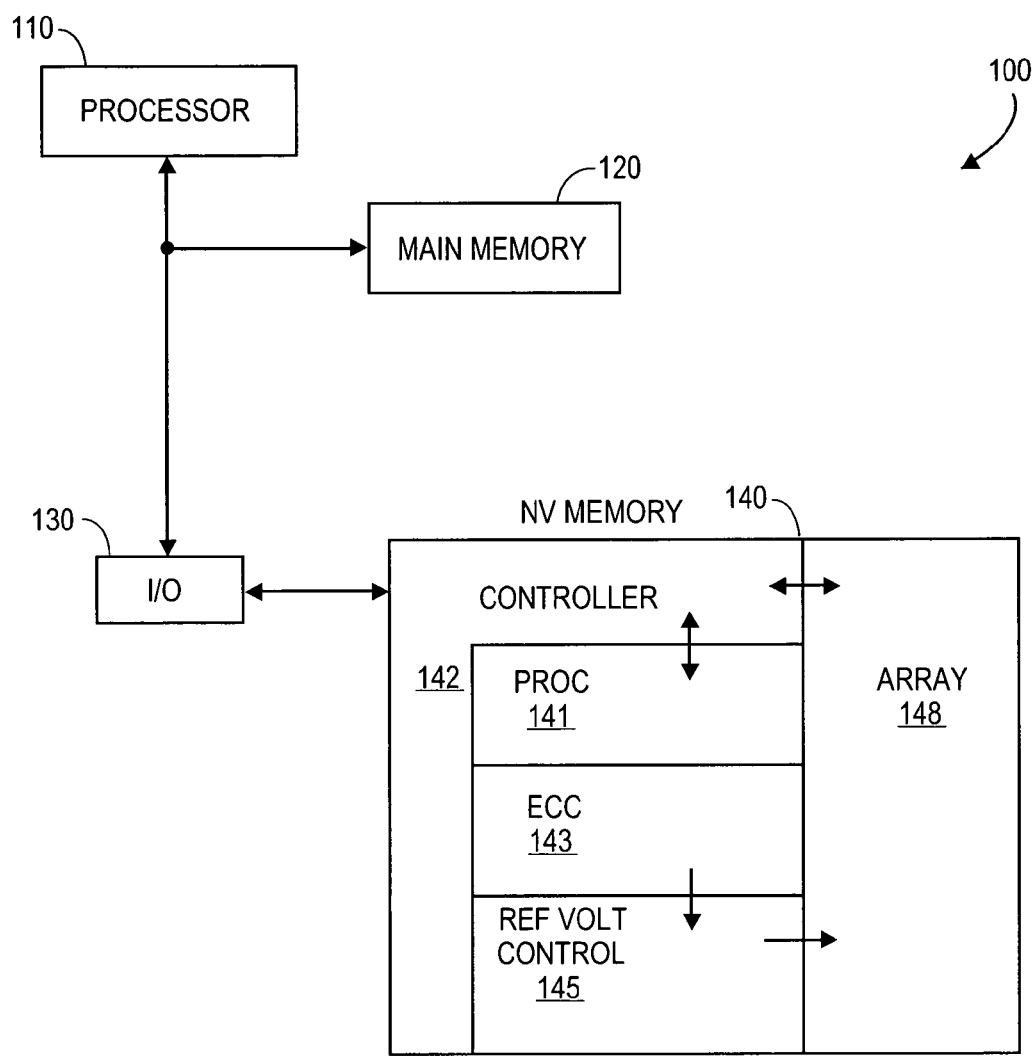
FIG. 1 shows a system containing a non-volatile memory, according to an embodiment of the invention.

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

Various embodiments of the invention may be implemented in one or any combination of hardware, firmware, and software. The invention may also be implemented as instructions contained in or on a computer-readable medium, which may be read and executed by one or more processors to enable performance of the operations described herein. A computer-readable medium may include any mechanism for storing information in a form readable by one or more computers. For example, a computer-readable medium may include a tangible storage medium, such as but not limited to read only memory (ROM); random access memory (RAM); magnetic disk storage media; optical storage media; a flash memory device, etc.

Various embodiments of the invention pertain to a technique of recovering data from a portion of a non-volatile memory which was not reliably read because the number of read errors exceeded the ability of the error checking and correcting (ECC) process to correct those errors. For each cell in that portion of memory, a quantized estimate may be made of the amount of offset in the read reference voltage that is predicted to correct for any systematic noise that may have affected the reading of that cell. For each quantized offset, the read reference voltage is adjusted by that amount and data from the relevant cells is read. The combined results for all the cells are then processed through the ECC again.

FIG. 1 shows a system containing a non-volatile memory, according to an embodiment of the invention. The illustrated system 100 comprises a processor 110, a main memory 120, input-output logic 130, and a non-volatile (NV) memory 140. In this particular implementation, the NV memory is attached as an I/O device (such as but not limited to a solid-state disk), but other embodiments may place the NV memory elsewhere in the system (such as but not limited to a part of the main memory itself, a cache memory working in cooperation a hard disk drive, etc.), or it may be operable as a standalone device. Various embodiments of the invention should be usable in diverse applications, and in different parts of a system, whether or not those applications and parts are specifically described here.

The NV memory may employ any feasible type of NV storage technology that uses an adjustable reference voltage for read operations. It may be particularly useful in NV memory that reads an entire range of sequential memory locations with a single read command (such as but not limited to reading a page of memory from a NAND flash memory array), rather than reading an individual byte or word with a single read command.

In the illustrated embodiment of FIG. 1, NV memory 140 may comprise a storage array 148 and a memory controller 142 to control operations with the array such as read, write, erase, and adjustment of reference voltages. As the term is used herein, a 'memory controller' such as 142 is the functional entity that takes a read, write, erase, or other request, and causes operations to be performed within the NV memory 140 to satisfy that request. In some embodiments the memory controller may include a processor to provide the overall control, but other embodiments may use other techniques (state machine, discrete logic, etc.). The controller 142 of the example may be further comprised of functional units, such as processor 141, error checking and correction (ECC) unit 143 and reference voltage control unit 145. Although the various units in FIG. 1 are shown as separate functional units, they may share common physical circuitry and/or code.

Whenever the controller 142 receives a read request from the processor 110 or other device, the controller may initiate an operation that reads data from multiple sequential storage locations in the array. The starting address of the locations may be indicated by the read request, while the number of locations may be specified in the request or may be predefined in some other manner. As the data is read and placed in a buffer, the ECC unit may detect whether there are any errors in the data, and correct those errors if it is able to through its error-correction algorithm. After reading a block of data and correcting that data if possible, the controller may present the contents of that block of data to the processor and inform the processor whether the presented data is valid (any errors have been corrected) or invalid (errors have not been corrected). The size of this block of data may be any feasible size, but the size may generally be determined by the code-word size of the ECC unit. The code word size may or may not correspond to a standardized unit of data in the NV memory array 148, such as a sector, two sectors, a page, etc. (Note: the term 'block', as used herein, refers to a group of cells that collectively make up a defined segment of consecutively-addressed memory, such as the memory locations covered by a single codeword in the ECC process. It does not refer to an 'erase block', a commonly used term to describe the locations that must all be erased together.)

Figure 2A:
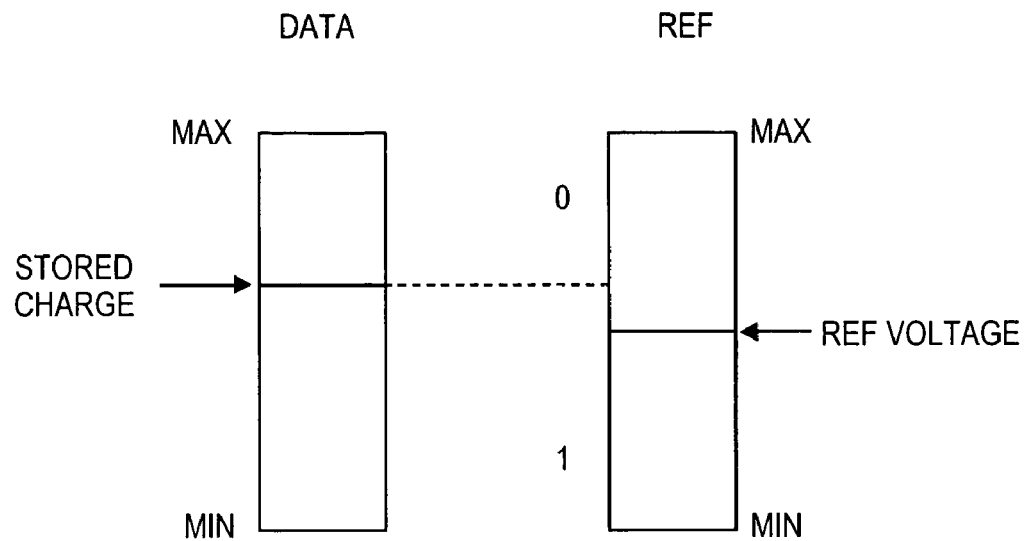
FIGS. 2A and 2B show bar charts indicating the charge in a single data cell compared to the reference voltage, according to an embodiment of the invention.
Figure 2B:
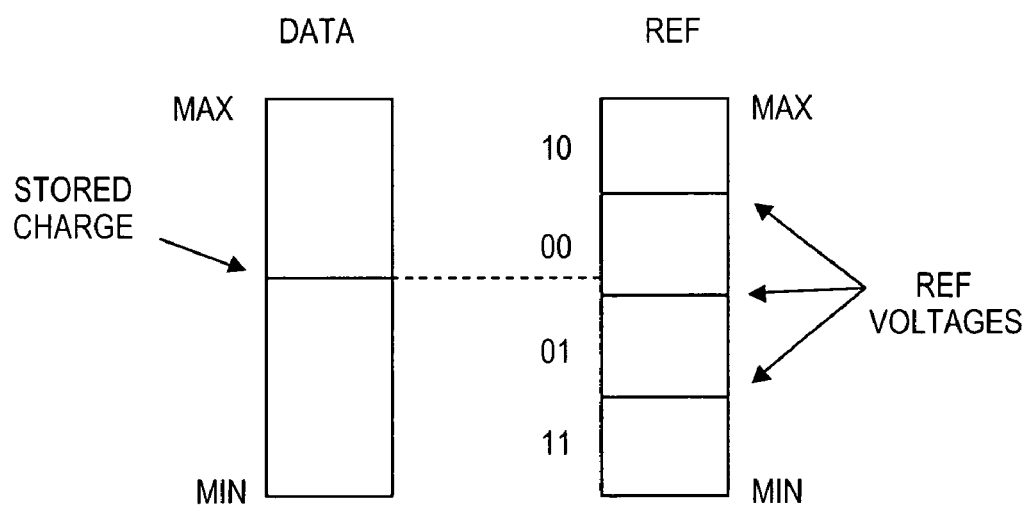

FIGS. 2A and 2B show bar charts indicating the charge in a single data cell compared to the reference voltage, according to an embodiment of the invention. FIG. 2A shows a single-bit-per-cell (SBC) configuration, in which a single binary bit is stored in each data cell. The reference voltage may be set at the factory to a value somewhere between the minimum and maximum values shown, but may later be adjusted by the memory controller during operation of the memory.

When writing data to the data cell (or when erasing the data cell), the stored charge in the data cell may be set to various values between the minimum and maximum values. During a read operation, a voltage comparator may be used to compare the voltage of the stored charge in the data cell with the reference voltage. If the voltage in the data cell is greater than the reference voltage (as shown in FIG. 2A), the cell may be considered to contain a binary '0'. Alternatively, if the voltage in the data cell is less than the reference voltage, the cell may be considered to contain a binary '1'. (Note: in some embodiments, this assignment of binary value to voltage range may be reversed, so that a voltage higher than the reference voltage would represent a '1', and lower than the reference voltage would represent a '0'. Assigning different voltage ranges to different binary values in this manner is well known in the art.)

As long as the voltage in the data cell and the reference voltage are not too close to each other in value, the voltage comparator should be able to make a non-ambiguous reading from the cell. However, charge leakage, electrical noise, or other phenomena can cause the data voltage and the reference voltages to get too close to each other, or may even cause one voltage to end up on the wrong side of the other voltage, resulting in an error when the cell is read. As previously stated, some errors may be corrected by implementing an ECC algorithm on the data read from multiple cells, provided the errors are not too numerous. However, if there are too many errors for the ECC algorithm to correct them, none of the data in that code-word-sized block of data may be considered reliable, and the location of the errors within that block may not be known.

FIG. 2B shows a multiple-bits-per-cell (MBC) configuration, in which a single data cell may be used to store multiple binary bits. In this particular example, three reference voltages are used to divide the potential voltage range into four parts, with each part representing a different two-bit combination, although other embodiments may use other quantities of reference voltages and bits per cell. In some embodiments, each of the reference voltages is stored separately, so that each can be adjusted without affecting the others. If the voltage of the stored charge in the data cell falls within one of the four indicated parts, it represents the two-bit binary value associated with that part. The particular two bit combinations shown in FIG. 2B use a Gray code, so that only one binary bit changes when transitioning across any reference voltage. However, any other assignment of multi-bit codes to each range is also possible. Although a 4-part, 3-reference voltage example is shown, other embodiments may store more bits in each data cell by using more reference voltages (e.g., 8-parts with 7-reference voltages to store three bits per cell).

Regardless of whether the NV memory uses memory cells containing one or multiple bits per cell, when performing a read operation the reference voltage may be applied to many cells at the same time. For example, the reference voltage may be applied to an entire page of data, and therefore be simultaneously applied to every cell within that page. Every bit of data that is stored in cells that make up that page may therefore be read at approximately the same time using the same reference voltage. Reference voltages may be adjusted before a read takes place, but the adjustments may be in incremental values. For example, in one embodiment the memory controller may be able to adjust the reference voltage in increments of 20 millivolts (mV), though other increments are equally feasible.

Figure 3:
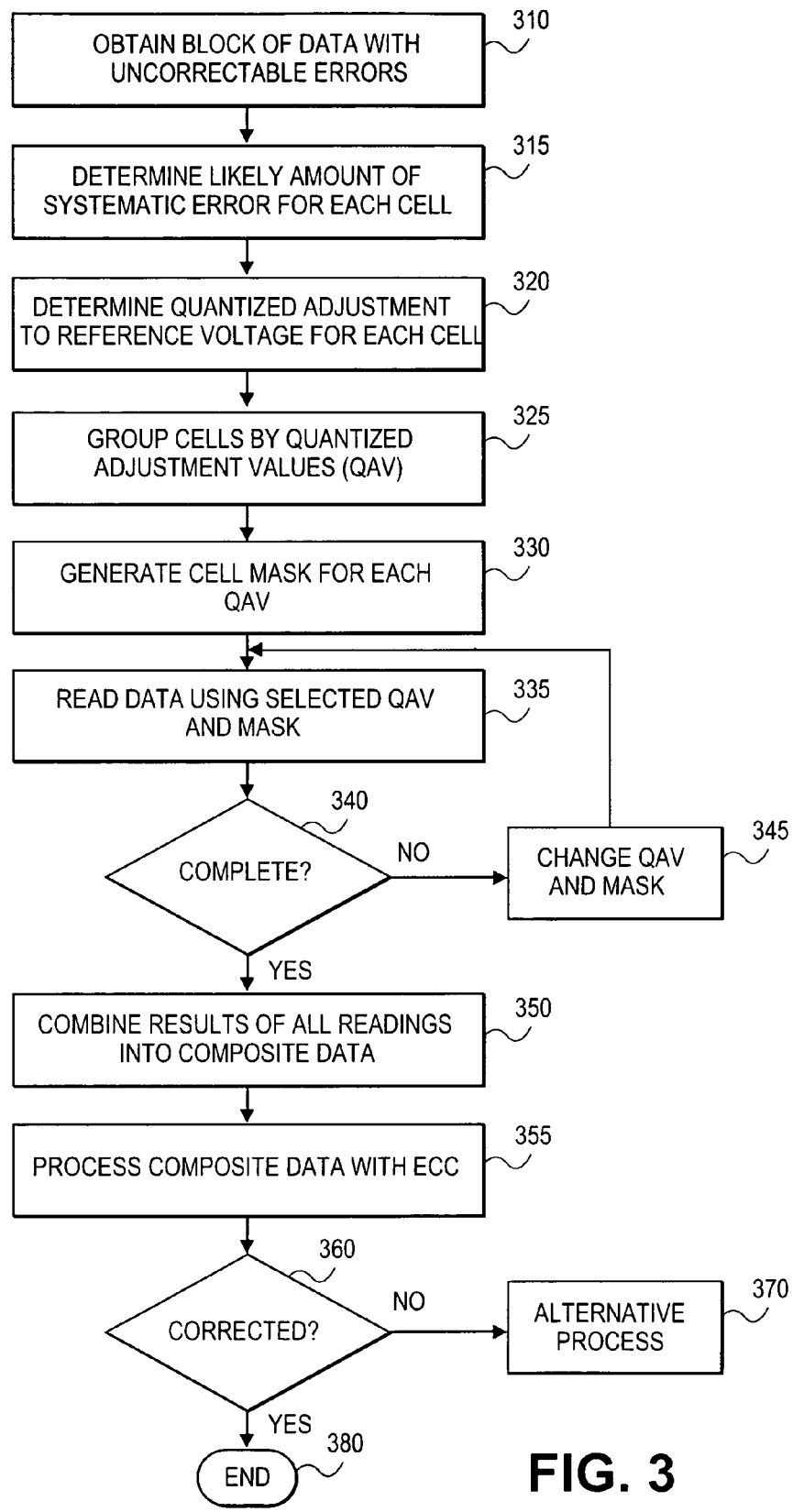
FIG. 3 shows a flow diagram of a method of correcting errors in a block of data read from a non-volatile memory, according to an embodiment of the invention.

FIG. 3 shows a flow diagram of a method of correcting errors in a block of data read from a non-volatile memory, according to an embodiment of the invention. The method may be performed by a processor within the memory controller, or by a combination of the memory controller and one or more processors external to the memory controller, such as processor 110 of FIG. 1. Before performing this method, in some instances it may be desirable to perform a moving read reference (MRR) procedure on the cells from which the block of data was read. In the MRR procedure, the read reference voltage is incremented through a range of voltages, and the data is read after each increment. By determining the reference voltage at which the binary value read from a cell changes, it is possible to determine the voltage of the charge in that cell, accurate to within the amount of the increment. It is possible to determine the charge levels of all cells (or only selected cells, if desired) in the block in this manner. If knowing these charge values can be of use in the procedures described herein, the MRR may be used to obtain those charge values. If not, the MRR procedure may be skipped.

In flow diagram 300, at 310 a block of data is obtained that is known to contain errors that were not correctable by the ECC unit associated with the NV memory. In some environments, some of these errors may be systematic. That is, they are caused by known conditions whose likely effects on a particular cell can be calculated. (Truly random errors are unpredictable and are not comprehended here.) Some examples, but not all examples, of these conditions are listed here:

1) Floating gate coupling—the charge levels stored in cells that are physically adjacent to the particular cell being examined (the target cell) may influence the charge in the target cell to read higher or lower than the correct value. The effect of various surrounding charge patterns on a target cell can be determined through experimentation and/or calculation. Because of the way that NV memories are constructed, the cells on adjacent bit lines are likely to be in a different block of data that was read correctly, so their effect can be determined with confidence. The adjacent cells on the same bit line may be in the same block as the target cell, and therefore might contain errors, so these cells might not be used, or might be used but with a lower level of confidence. Various embodiments may use different quantities of the adjacent cells (e.g., from 1 to 4 cells) to calculate the effect on the target cell.

2) Backpattern noise—the charge contained in the other cells on the same string (e.g., a group of cells serially connected source-to-drain in a line) can affect the reading of the target cell in that string.

3) String failure—the location of 1-to-0 errors from other correctible pages on the same string can have a predictable effect on the target cell.

4) Physical location in array—such as proximity to voltage sources or string drivers, being at the edge of the array, etc.)

At 315 the probable amount of systematic error in the charge level for each cell in the block may be determined. This may be done through calculation, through look-up table, or through any of various other suitable methods. The error in charge level may be converted to a value for a change in read reference voltage that is calculated to correct that error. When multiple sources may have an effect on the same cell, the collective effect of all those sources may be determined. If a particular cell has no known sources of systematic error, the error for that cell may be set to zero. By the very nature of this process, these calculated error effects may not reflect the exact actual effect of each source of error, but the values obtained are still useful for this process.

At 320, the resultant values for a change in the read reference voltage may be quantized. Within the scope of this document, 'quantized' means the change in reference voltage is converted to the nearest 'incremental' read reference voltage value that is likely to correct that error. Since the read reference voltage is typically based on an analog charge level, it may have any of many different values. But the read reference voltage is typically changed only in predefined increments. The size of these increments may be determined by various factors not discussed here, but in general a larger increment reduces the number of read cycles that are necessary later, but also decreases the accuracy of the process. Similarly, a smaller increment increases the number of read cycles that are necessary later, but also increases the accuracy of the process. A quantized value may be expressed either as the value of the increment(s) from normal, or the value of the reference voltage after the increment(s) are applied.

Once the indicated adjustment to every cell in the block has been quantized, the cells may be organized at 325 into groups having the same quantized value. For example, every cell having a quantized value of +20 mV may be placed in one group, every cell having a quantized value of −40 mV may be placed in another group, etc. At 330, cell masks may be generated, with a separate mask for each group. A cell mask may be used in conjunction with a read operation to mask out the read results from all cells except for the cells that are associated with that particular quantized value.

At 335, the read reference voltage may be adjusted to the first quantized value, and then a read operation may be performed on the block of data. The associated mask may be used so that only the data from the cells associated with that particular group and quantized value are kept. This process may be repeated at 335-340-345 using each of the adjusted read reference voltages and reading each of the groups of cells using the associated mask. When all the groups/masks/quantized values have been used in this manner, as determined at 340, all the data that is in question (i.e., all the data from the code word block that is in question) should have been read.

The data from these reads may then be combined at 350 into a single block of data and processed through the ECC unit at 355 to see if the read errors have been reduced enough that the ECC can correct them. If so, as determined at 360, this process may end at 380 and the now-valid data may be used as desired. For example, it may be stored in another storage system, or it may be restored to the original data storage system in an area that is not subject to as many read errors. However, if the data block still fails the ECC process, other procedures may be followed at 370. Such procedures may include but are not limited to things such as: 1) repeat the process using different assumptions about the various systematic effects on the cells, 2) use a different approach, not described here, to obtain correct data, 3) treat the data as lost, 4) etc.

It should be noted that in some embodiments the amount of data read in a read operation (for example, a page of data) may be larger than the amount of data in the block, because the code word size is smaller than the size of the data read in a standard read operation. In such cases, the data read at 335 that is outside the data block in question may be ignored or masked out.

Figure 4:
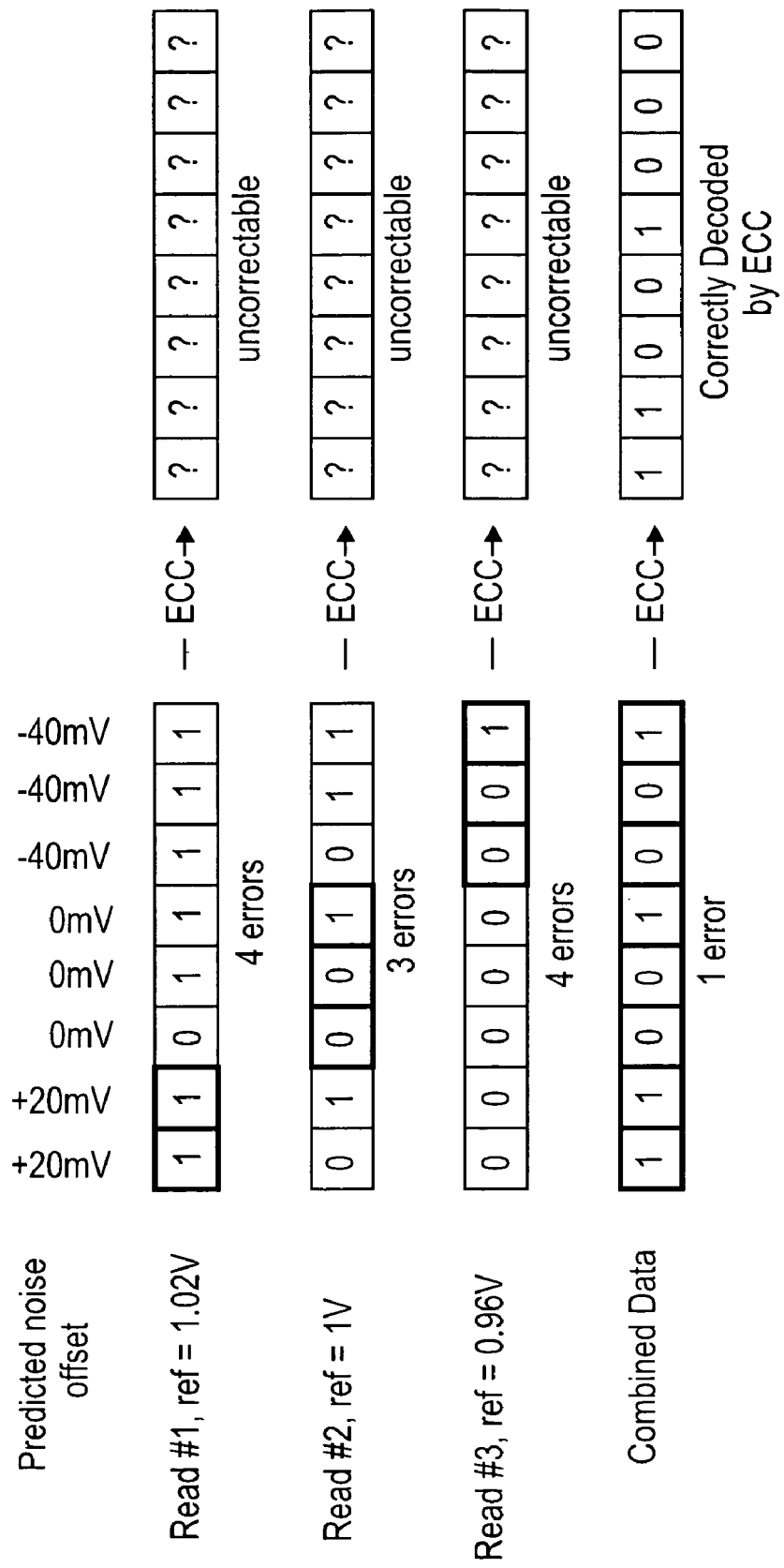
FIG. 4 shows a diagram of data being read using a variety of quantized read reference voltage values, according to an embodiment of the invention.

In the example of FIG. 3, the ECC is not performed until masked data from all the groups/masks/quantized values have been obtained and combined. However, in some operations it may be efficient to perform an ECC after each read operation, just to see if that single correction reduces errors to a level that can be corrected by the ECC. If any of these read operations, by itself, produces correctable data, the remaining read operations may be skipped. FIG. 4 shows such as approach.

FIG. 4 shows a diagram of data being read using a variety of quantized read reference voltage values, according to an embodiment of the invention. This example assumes a standard read reference voltage of 1.00 volts, with quantized increments of plus and minus 20 mV from that standard. For simplicity of illustration, only eight bits are shown (assuming a code word size of one byte), but the principle may easily be scaled up to more typical codeword sizes, such as 512 bytes, 2048 bytes, etc. Also for simplicity, single bit per cell (SBT) technology is assumed so that bits and cells are interchangeable in the description, but the principle is easily extended to multiple-bit-per-cell technologies.

In this example it is assumed that prior calculations have determined that the first two bits are probably experiencing systematic noise that can be corrected by adding an additional 20 mV to the initial read reference voltage, the last three bits are probably experiencing systematic noise that can be corrected by reducing the initial read reference voltage by 40 mV, and the remaining bits probably require no correction in the read reference voltage.

Accordingly, for the first read, the read reference voltage is set to 1.020 volts. The entire block of data may be read with that reference voltage, but since only the first two bits were determined to need this correction, the associated mask may be used to save only the first two bits, which are '11' for this read operation. For the second read operation, the reference voltage is set at 1.000 volts, and the second mask used to save only the next three bits, which are '001' for this read operation. In this example, no cells were determined to need a correction using 0.980 volts, so that increment is skipped and the third read operation uses a reference voltage of 0.960 volts. Again, the appropriate mask is used to separate and save the last three bits, which are '001' for this read operation.

The masked data from all the reads may be combined to produce '11001001'. This composite block of data is then processed by the ECC. This example assumes there is now only one error (the last bit), and this can be corrected by the ECC to '11001000', resulting in the correct data. This example assumes the ECC processing is not attempted until all the reads have been done and the composite data is available. In some embodiments, where the ECC mechanism is simple to implement and relatively fast, an ECC might be performed after each read on the data obtained with that read reference voltage. If any of those ECC operations produces correct data, the remaining read may be skipped.

In still another embodiment that represents a variation of the approach in FIG. 4, each read after the first read may combine the masked data obtained from the current read with the masked data obtained from the previous reads. The remaining data in the block may be set to the initial data (e.g., the data obtained at 310 in FIG. 3). This composite of data may then be processed by the ECC after each read (or after every x reads). In this manner, each successive read is presumed to contain more corrected data than the previous read, and is presumably more likely to have a correctable number of errors. When the ECC finally produces correct data, no further reads are necessary and the remaining reads in the process may be aborted.

The foregoing description is intended to be illustrative and not limiting. Variations will occur to those of skill in the art. Those variations are intended to be included in the various embodiments of the invention, which are limited only by the scope of the following claims.

What is claimed is:

1. An apparatus, comprising
a processor and a non-volatile (NV) memory, the NV memory comprising a memory controller to control reading a NV memory array, the apparatus to perform operations comprising:
   obtaining a block of binary data read from a specified range of sequentially-addressed memory cells in a charge-based non-volatile (NV) memory, the block containing errors that were uncorrectable by an error checking and correcting (ECC) unit, the block covering a single codeword in an ECC process;
   determining, for each of the memory cells in the range of memory cells, respective changes in read reference voltages that would offset effects of systematic noise on each of the memory cells in the range of memory cells, to produce respective changed read reference voltages;
   quantizing the respective changed read reference voltages into multiple quantized values, the multiple quantized values being nearest incremental read reference voltage values that are likely to correct the errors;
   organizing the memory cells into groups, each group associated with a particular respective one of the multiple quantized values;
   changing the read reference voltage to equal a first of the quantized values;
   reading data from the group of memory cells associated with the first of the quantized values such that only the data from the group associated with the first of the quantized values is retained;
   repeating iterations of said changing and said reading for each of the other groups associated with the other quantized values, such that, in the iterations of the reading, only respective data from respective ones of the groups associated with respective ones of the quantized values is retained;
   combining the respective data obtained with and retained in said changing, said reading, and said repeating, into a combined data set covering the codeword; and
   processing the combined data set through the ECC process.

2. The apparatus of claim 1, wherein the NV memory array comprises a NAND flash memory array.

3. The apparatus of claim 1, wherein said reading comprises using a mask to discard data from memory cells that is not to be retained.

4. The apparatus of claim 1, wherein said effects of systematic noise comprise one or more effects selected from a list consisting of:
   a) floating gate coupling;
   b) backpattern noise;
   c) string failure; and
   d) physical location in array.

5. The apparatus of claim 4, wherein the effect of floating gate coupling is selected for a target cell, and effects of charge in a cell physically adjacent to the target cell is considered.

6. The apparatus of claim 1, wherein each cell in the block uses multi-bits per cell technology.

7. The apparatus of claim 1, wherein said determining is preceded by a moving read reference (MRR) procedure.

8. The apparatus of claim 1, wherein the NV memory comprises a solid-state disk.

9. A method, comprising:
   obtaining a block of binary data read from a specified range of sequentially-addressed memory cells in a charge-based non-volatile (NV) memory, the block containing errors that were uncorrectable by an error checking and correcting (ECC) unit associated with the NV memory, the block covering a single codeword in an ECC process;
   determining, for each of the memory cells in the range of memory cells, respective changes in read reference voltages that would offset effects of systematic noise on each of the memory cells in the range of memory cells, to produce respective changed read reference voltages;
   quantizing the respective changed read reference voltage values into multiple quantized values, the multiple quantized values being nearest incremental read reference voltage values that are likely to correct the errors;
   organizing the memory cells into groups, each group associated with a particular respective one of the multiple quantized values;
   changing the read reference voltage to equal a first of the quantized values;
   reading data from the group of memory cells associated with the first of the quantized values such that only the data from the group associated with the first of the quantized values is retained;
   repeating iterations of said changing and said reading for each of the other groups associated with other quantized values, such that, in the iterations of the reading, only respective data from respective ones of the groups associated with respective ones of the quantized values is retained;
   combining the respective data retained in said changing, said reading, and said repeating into a combined data set covering the codeword; and
   processing the combined data set through the ECC process.

10. The method of claim 9, wherein each cell in the block uses multi-bits per cell technology.

11. The method of claim 9, where said determining is preceded by a moving read reference (MRR) procedure.

12. The method of claim 9, wherein said reading comprises using a mask to discard data from memory cells that is not to be retained associated with the group.

13. The method of claim 9, wherein said effects of systematic noise comprise one or more effects selected from a list consisting of:
    a) floating gate coupling;
    b) backpattern noise;
    c) string failure; and
    d) physical location in array.

14. The method of claim 13, wherein the effect of floating gate coupling is selected for a target cell, and effects of charge in a cell physically adjacent to the target cell is considered.

15. An article comprising
    a non-transitory computer-readable storage medium that contains instructions, which when executed by one or more processors result in performing operations comprising:
        obtaining a block of binary data read from a specified range of sequentially-addressed memory cells in a charge-based non-volatile (NV) memory, the block containing errors that were uncorrectable by an error correcting code (ECC) unit associated with the NV memory, the block covering a single codeword in an ECC process;
        determining, for each of the memory cells in the range of memory cells, respective offset values in a read reference voltages that would offset effects of systematic noise on each of the memory cells in the range of memory cells;
        quantizing the respective offset values into multiple quantized values, the multiple quantized values being nearest incremental read reference voltage values that are likely to correct the errors;
        organizing the memory cells into groups, each group associated with a particular respective one of the multiple quantized values;
        changing the read reference voltage to equal a first of the quantized values;
        reading data from the group of memory cells associated with the first of the quantized values such that only the data from the group associated with the first of the quantized values is retained;
        repeating iterations of said changing and said reading for each of the other groups associated with the other quantized values, such that, in the iterations of the reading, only respective data from respective ones of the groups associated with respective ones of the quantized values is retained;
        combining the respective data retained in said changing, said reading, and said repeating into a combined data set covering the codeword; and
        processing the combined data set through the ECC process.

16. The article of claim 15, wherein said reading comprises using a mask to discard data from memory cells that is not to be retained.

17. The article of claim 15, wherein said effects of systematic noise comprise one or more effects selected from a list consisting of:
    a) floating gate coupling;
    b) backpattern noise;
    c) string failure; and
    d) physical location in array.

18. The article of claim 17, wherein the effect of floating gate coupling is selected for a target cell, and effects of charge in a cell physically adjacent to the target cell is considered.

19. The article of claim 15, wherein each cell in the block uses multi-bits per cell technology.

20. The article of claim 15, where said determining is preceded by a moving read reference (MRR) procedure.

* * * * *